(12) United States Patent  (10) Patent No.: US 8,797,100 B2
Balm et al.  (45) Date of Patent: Aug. 5, 2014

(54) CIRCUIT UNIT, BIAS CIRCUIT WITH CIRCUIT UNIT AND DIFFERENTIAL AMPLIFIER CIRCUIT WITH FIRST AND SECOND CIRCUIT UNIT

(75) Inventors: Bart Balm, Kekerdom (NL); Jeroen Bouwman, Nijmegen (NL); Léon C. M. van den Oever, Rosmalen (NL)

(73) Assignee: Epcos AG, Munich (DE)

( * ) Notice: Subject to any disclaimer, the term of this patent is extended or adjusted under 35 U.S.C. 154(b) by 51 days.

(21) Appl. No.: 13/582,132

(22) PCT Filed: Mar. 5, 2010

(86) PCT No.: PCT/EP2010/052855
§ 371 (c)(1),
(2), (4) Date: Sep. 10, 2012

(87) PCT Pub. No.: WO2011/107159
PCT Pub. Date: Sep. 9, 2011

(65) Prior Publication Data
US 2013/0033322 A1  Feb. 7, 2013

(51) Int. Cl.
*H03F 3/16* (2006.01)
*H03F 3/45* (2006.01)
(52) U.S. Cl.
USPC .......................................... 330/300; 330/252
(58) Field of Classification Search
CPC ................ H03F 3/14; H03F 3/16; H03F 3/68
USPC .......................................... 330/300, 307, 311
See application file for complete search history.

(56) References Cited

U.S. PATENT DOCUMENTS 7,619,482 B1  11/2009  Kobayashi
7,932,539 B2 *  4/2011  Chen et al. .................... 257/194

FOREIGN PATENT DOCUMENTS

| JP | 60-143012 A | 7/1985 |
| JP | 09-246877 A | 9/1997 |
| JP | 10-284957 A | 10/1998 |
| JP | 11-195939 A | 7/1999 |
| JP | 2004-064262 A | 2/2004 |
| JP | 2007--520163 A | 7/2007 |
| JP | 2010-278704 A | 9/2010 |
| JP | 2011-187055 A | 9/2011 |

OTHER PUBLICATIONS

International Search Report corresponding to co-pending International Patent Application Serial No. PCT/EP2010/052855, European Patent Office, dated Jan. 31, 2011; (4 pages).
De la Rosa G. et al. "A GSM-EDGE Power Amplifier with a BiFET Current Limiting Bias Circuit" Radio Frequency Integrated Circuits Symposium, 2009, IEEE, pp. 595-598.
Examination Report corresponding to co-pending Japanese Patent Application Serial No. 2012-555307, Japanese Patent Office, dated Sep. 3, 2013; (5 pages).

* cited by examiner

*Primary Examiner* — Steven J Mottola
(74) *Attorney, Agent, or Firm* — Nixon Peabody LLP (57) ABSTRACT

Circuit unit (CU) comprising a heterojunction bipolar transistor and a long-gate pseudomorphic high-electron-mobility transistor. Either a source (S) or a drain (D) of the long-gate pseudomorphic high-electron-mobility transistor is electrically coupled with either a collector (C) or an emitter (E) of the heterojunction bipolar transistor.

12 Claims, 10 Drawing Sheets

CIRCUIT UNIT, BIAS CIRCUIT WITH CIRCUIT UNIT AND DIFFERENTIAL AMPLIFIER CIRCUIT WITH FIRST AND SECOND CIRCUIT UNIT

CROSS-REFERENCE TO RELATED APPLICATIONS

This application is a U.S. National Stage of International Application No. PCT/EP2010/052855, filed Mar. 5, 2010, which is incorporated herein by reference in its entirety.

The present invention relates to a circuit unit and a bias circuit with a circuit unit and a differential amplifier circuit with a first and a second circuit unit.

Differential amplifier circuits are generally known for amplifying differential signals. Differential amplifier circuits are used in operational amplifiers or other circuits like for example comparators, Gilbert cell type mixers or oscillators. The differential amplifier is operable to amplify the difference between two input signals.

The object of the invention is to provide a circuit unit and differential amplifier circuit which facilitates a high voltage gain and which have only small space-requirements. Furthermore, an object of the invention is to provide a bias circuit which facilitates a small current provision.

These objects are achieved by the features of the independent claims. Aspects and several embodiments are subject to the dependent claims.

The invention according to a first aspect is distinguished by a circuit unit which comprises a heterojunction bipolar transistor and a long-gate pseudomorphic high-electron-mobility transistor. Either a source or a drain of the long-gate pseudomorphic high-electron-mobility transistor is electrically coupled with either a collector or an emitter of the heterojunction bipolar transistor.

The heterojunction bipolar transistor or HET as well as the long-gate pseudomorphic high-electron-mobility transistor or pHEMT may be formed in GaAs technology, where a long-gate pHEMT is characterised by a significantly longer channel compared with conventional pHEMTs. The HBT has a high transconductance and the long-gate pHEMT has high impedance when for example configured as active load. This facilitates high voltage gains. Furthermore, due to the long channel of the long-gate pHEMT, circuit arrangements with such circuit units feature very small power requirements.

Preferably, the HBT of the circuit unit is an npn-HBT and the long-gate pHEMT is a depletion-mode long-gate pHEMT. Depletion mode transistors are not conducting between a source and a drain if the gate-source voltage is more negative than a negative threshold voltage of the transistor. Depletion mode transistors are conducting between the source and the drain in the case of a gate-source voltage above the threshold voltage that means less negative, zero or positive. Enhancement mode transistors are conducting between the source and the drain if the gate-source voltage is larger positive than a positive threshold voltage and are not conducting between the source and the drain if the gain-source voltage is lower.

The long-gate pHEMT may be configured as active load by electrically shorting or bypassing its gate to its source, so that a voltage between the gate electrode and the source electrode is 0 V. In this configuration, the long-gate pHEMT may be used instead of conventional resistors, in particular in AC-circuit arrangements. Such long-gate pHEMTs as active loads have the advantage of a significant less space requirement on the chip compared with conventional resistors in particular made in the same process. The source of the long-gate pHEMT is preferably electrically coupled to the collector of the heterojunction bipolar transistor.

In an embodiment of the first aspect the long-gate pseudomorphic high-electron-mobility transistor comprises a channel length which is equal or larger than 0.5 µm. The long-gate pseudomorphic high-electron-mobility transistor may comprise a channel size ratio of channel width to channel length between 0.01 and 0.4 with a channel length which is equal or larger than 0.5 µm, in particular the channel length may be between 0.5 to 1000 µm. The current flows along the channel between source and drain. This has the advantage of high impedance and a small current provision.

In a further embodiment of the first aspect the long-gate pHEMT of the circuit unit comprises the channel with a channel length L being significantly larger than a channel width W. The channel length L may be 40 µm and the channel width W may be 3 µm. The channel is an area located beneath the gate electrode. The current flows through the channel between source and drain.

A FET or a pHEMT having a channel dimensioned as described above is a long-gate FET or pHEMT, which may serve as current source having a relative low current value in comparison with a conventional FET realised in a similar chip area.

In a further embodiment of the first aspect the circuit unit is integrated on a single chip by using GaAs BiFET or BiHEMT technology. Especially merged or stacked FET-HBT integration schemes, often called BiFET or BiHEMT and containing both HBT and FET or pHEMT devices on a single GaAs substrate, can be used to render a low-current circuitry. With BiFET it is possible to combine npn bipolar transistors with long-gate pHEMTs to obtain better electrical performance than for HBT only or pHEMT only.

The invention according to a second aspect is distinguished by a bias circuit with a circuit unit according to the first aspect. The HBT of the circuit unit is identified as a sixth control element and the long-gate pHEMT of the circuit unit is identified as a seventh control element. The bias circuit further comprises a fifth control element which comprises another HBT. A base and a collector of the sixth control element are electrically shorted. A base of the fifth control element is electrically coupled to the base of the sixth control element. This facilitates a bias circuit being operable to provide very small currents. At the same time such a bias circuit only has very small space requirements on a single substrate. The base and the collector of the sixth control element are electrically shortened, so that a voltage between the base and the collector is 0 V. The fifth control element may be an npn-type HBT.

The terms "fifth control element", "sixth control element" and "seventh control element" represent only names of the particular control element of the bias circuit and does not imply, that the bias circuit also comprises a first to fourth control element. The terms only serve to differentiate the control elements of the bias circuit in the claims and the description.

In an embodiment of the second aspect, a gate and a source of the seventh control element is electrically shorted or bypassed. The gate and the source of the seventh control element are shorted or bypassed such that a gate-source voltage is 0 V. This configures the long-gate pHEMT of the circuit unit as active load. In this configuration, the seventh control element represents a current source with high impedance.

The invention according to a third aspect is distinguished by a differential amplifier circuit which comprises a first circuit unit according to the first aspect, with its HBT being identified as a first control element and with its long-gate pHEMT being identified as a second control element. The differential amplifier circuit also comprises a second circuit unit according to the first aspect, with its HBT being identified as a third control element and with its long-gate pHEMT being identified as a fourth control element. The first control element and the third control element are electrically coupled via a connection point and the second control element and the fourth control element are electrically coupled via a further connection point. Furthermore, the differential amplifier circuit comprises a current sink which is electrically arranged between a reference potential and the connection point. The current sink is operable to demand a predetermined current through the first circuit unit and/or the second circuit unit.

Such a differential amplifier circuit has only small power requirements. The first and third control element represent the differential pair of the differential amplifier circuit, whereas a base of the first control element may be supplied with a first predetermined signal and a base of the third control element may be supplied with a second predetermined signal. The differential amplifier circuit may be operated symmetrically or asymmetrically. In case of the symmetrical operation, an output voltage of the differential amplifier circuit may be determined between a first common electrical coupling between the first and second control element and a second common electrical coupling between the third and fourth control element. In case of an asymmetrical operation, the output voltage may be either determined between the first common electrical coupling and the reference potential or between the second common electrical coupling and the reference potential. The current sink may be a current source, in particular a constant current source.

A voltage supply source may be coupled to the differential amplifier circuit which is electrically coupled to the further connection point and which is operable to supply the first circuit unit and the second circuit unit with a predetermined supply voltage.

The terms "first control element", "second control element", "third control element" and "fourth control element" represent only names of the particular control element of the differential amplifier. The terms only serve to differentiate the control elements of the bias circuit in the claim and the description.

In an embodiment of the third aspect, the current sink comprises a bias circuit according to the second aspect. The fifth control element of the bias circuit is electrically arranged between the reference potential and the connection point. The circuit unit of the bias circuit is electrically arranged between the reference potential and the further connection point. A drain of the seventh control element may be electrically coupled to the further connection point and an emitter of the sixth control element may be electrically coupled to the reference potential. The bias circuit contributes to predetermining a very small current.

In a further embodiment of the third aspect, the current sink comprises an eighth control element which is a depletion-mode long-gate pHEMT with its gate and source being electrically shorted. The eighth control element is electrically arranged between the reference potential and the connection point. A drain of the eighth control element may be electrically coupled to the connection point and a source of the eighth control element may be electrically coupled to the reference potential. In this configuration the eighth control element represents a current source with high impedance.

The terms "eighth control element" represents only a name of the control element. The term only serves to differentiate this control element from the others of the differential amplifier circuit.

In a further embodiment of the third aspect, a gate of the second control element and a gate of the fourth control element are electrically coupled to the electrically shorted gate and source of the seventh control element. This results in a gate-drain voltage of the seventh control element which is basically identical to the gate-drain voltage of the second and fourth control element. The seventh control element represents a reference current generator. A gate-source voltage of the second control element and a gate-source voltage of the fourth control element are dependent on the first branch current and on the second branch current, respectively. The first and second branch current sums in the current demanded by the current sink. This has the advantage of stable settings of the current without the need of additional circuitry.

The second and fourth control element are configured as active loads, so that conventional resistors may be replaced by the second and fourth control element. This contributes to reducing a required chip area and at the same time to increasing a voltage gain.

In a further embodiment of the third aspect, a gate of the second control element and a gate of the fourth control element are electrically coupled to each other. The gate and a source of either the second control element or the fourth control element are electrically shorted or bypassed. The gate and the source of either the second or fourth control element are shorted or bypassed such that a gate-source voltage is 0 V. This facilitates to operate the differential amplifier circuit as single-ended or asymmetrical amplifier circuit.

In a further embodiment of the third aspect, a gate and a source of the second control element are electrically shorted or bypassed and a gate and a source of the fourth control element are electrically shorted or bypassed. The gate and the source of the second control element are shorted or bypassed such that a gate-source voltage is 0 V. The gate and the source of the fourth control element are shorted or bypassed such that a gate-source voltage is 0 V. This facilitates to operate the second control element and the fourth control element as active loads with high impedance.

In a further embodiment of the third aspect, the differential amplifier circuit is integrated on a single chip. In particular GaAs BiFET-technology enables to integrate HBTs and long-gate pHEMTs on a single substrate. This has the advantage to combine HBTs, which feature high transconductance values, with long-gate pHEMTs, which feature high impedance values. This contributes to increasing a voltage gain of the differential amplifier circuit and at the same time contributes to reducing the space-requirements of the differential amplifier circuit on the substrate. A single chip has the advantage of simpler assembly and less cost and size requirements.

Furthermore, the differential amplifier circuit may be used in an operational amplifier where it solves a number of problems:

the operational amplifier needs fewer cascaded stages to achieve a certain open loop gain, the design of an operational amplifier with fewer cascaded stages is less complex, because it has less poles and hence less stability issues, an operational amplifier with higher gain per stage has less problems with voltage headroom, particularly when it needs to work from DC, e.g. a supply regulator or power control loop, an operational amplifier with fewer cascaded stages suffers less from DC offset, an operational amplifier with fewer cascaded stages can have lower current consumption, an operational amplifier with fewer cascaded stages can be implemented in smaller layout area, an operational amplifier with fewer cascaded stages generates less noise.

These advantages can also be assigned to other applications if one or more circuit units are used within the particular application, as for example inverters, comparators, Gilbert cell type mixers or oscillators.

In the following, the disclosure is described in further detail with reference to the drawings, wherein FIG. 1 first embodiment of a differential amplifier circuit, FIG. 2 second embodiment of a differential amplifier circuit, FIG. 3a-3d simulation results of a second embodiment, FIG. 4 third embodiment of a differential amplifier circuit, FIG. 5 fourth embodiment of a differential amplifier circuit, FIG. 6a-6d simulation results of a fourth embodiment, FIG. 7 fifth embodiment of a differential amplifier circuit, FIG. 8a-8d simulation results of a fifth embodiment, and FIG. 9a-9d further simulation results, FIG. 10 another amplifier circuit.

Elements of the same design and function that appear in different illustrations are identified by the same reference character.

Figure 1:
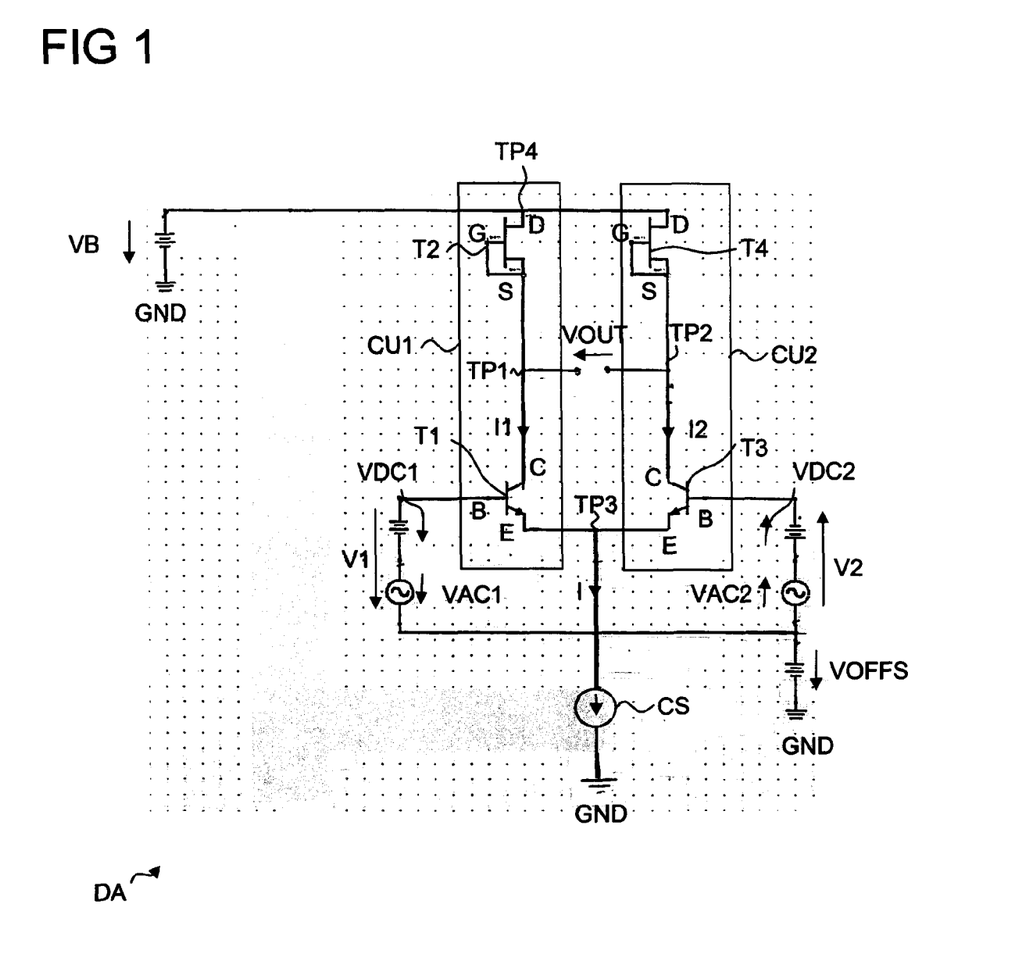

FIG. 1 depicts a first embodiment of a differential amplifier circuit DA. The differential amplifier circuit DA comprises a first circuit unit CU1 and a second circuit unit CU2 and a current sink CS. A voltage supply source which provides a predetermined supply voltage VB and a first signal source and a second signal source providing a first predetermined voltage V1 and a second predetermined voltage V2 are coupled to the differential amplifier circuit DA. The first predetermined voltage V1 comprises a first DC-voltage VDC1 and a first AC-voltage VAC1. The second predetermined voltage V2 comprises a second DC-voltage VDC2 and a second AC-voltage VAC2. Both predetermined voltages V1, V2 may additionally comprise an offset voltage VOFFS, which contributes to operate the first circuit unit and second circuit unit for example in a positive voltage range.

The first circuit unit CU1 comprises a first control element T1 and a second control element T2. The first control element T1 is an npn-type heterojunction bipolar transistor or npn-HBT and the second control element T2 is a depletion-mode long-gate pseudomorphic high-electron-mobility transistor or D-mode long-gate pHEMT.

A pHEMT is a field effect transistor with high mobility electrons in its channel by incorporating one or more junctions between materials with different bandgaps, for example GaAs and AlGaAs.

A collector C of the first control element T1 is electrically coupled to a source S of the second control element T2 via a first connection point TP1. A gate G and the source S of the second control element T2 is electrically shorted, so that a voltage between the gate G and source S is 0 V.

A base B of the first control element T1 is electrically coupled to the first signal source and suppliable with the first predetermined voltage V1.

The second circuit unit CU2 comprises a third control element T3 and a fourth control element T4. The third control element T3 is an npn-HBT and the fourth control element T4 is a D-mode long-gate pHEMT. A collector C of the third control element T3 is electrically coupled to a source S of the fourth control element T4 via a second connection point TP2. A gate G and the source S of the fourth control element T4 are electrically shorted.

Both, the second and fourth control element T2, T4 represent active loads.

A symmetrical output voltage VOUT can be determined between the first connection point TP1 and the second connection point TP2.

A base B of the third control element T3 is electrically coupled to the second signal source and is suppliable with the second predetermined voltage V2. The second predetermined voltage V2 may comprise an opposite polarization as the first predetermined voltage V1.

An emitter E of the first control element T1 and an emitter E of the third control element T3 are electrically coupled to each other via a third connection point TP3. The third convection point TP3 may also be identified as connection point.

A drain D of the second control element T2 and a drain D of the fourth control element T4 are electrically coupled to each other via a fourth connection point TP4. The fourth connection point TP4 may also be identified as further connection point.

The current sink CS is electrically arranged between the third connection point TP3 and a reference potential GND. The current sink CS is operable to demand a predetermined current I which is basically a sum of a first branch current I1 and a second branch current I2, in particular with neglecting the base currents. The first branch current I1 is associated with the first circuit unit CU1 and the second branch current I2 is associated with the second circuit unit CU2.

The fourth connection point TP4 is suppliable with the predetermined supply voltage VB.

The differential amplifier circuit DA is integrated on a single-chip formed by for example using a GaAs BiFET technology process. The GaAs BiFET technology is a stacked or merged technology of GaAs HBTs and GaAs pHEMTs.

The second control element T2 and the fourth control element T4 represent current sources with high impedance and may be used instead of conventional resistors, as for example thin-film resistors.

In a second embodiment (FIG. 2) the current sink CS may comprise another control element which is identified as eighth control element T8 in the further description. The eighth control element T8 may also be a D-mode long-gate pHEMT with its gate G and its source S being electrically shorted. A drain D of the eighth control element T8 is electrically coupled to the third connection point TP3 and the source S of the eighth control element T8 is electrically coupled to the reference potential GND. The eighth control element T8 operates as a current source with high impedance and is operable to demand the predetermined current I, for example 50 µA.

Long-gate pHEMTs have a predetermined channel size ratio W/L of a channel width W to a channel length L, as for example W/L=0.4. The channel length L of a long-gate pHEMT may be equal or larger than 0.5 µm, in particular between 0.5 to 1000 µm. The channel length L of a conventional pHEMT is approximately 0.5 µm.

FIGS. 3a to 3d, 6a to 6d and 8a to 8d illustrate diagrams of simulation results of different amplifier circuits. The diagrams refer to simulation results of the differential amplifier circuit DA according to the invention and to simulation results of a E-mode pHEMT amplifier circuit and to simulation results of a D-mode pHEMT amplifier circuit.

The E-mode pHEMT amplifier differs from the differential amplifier circuit DA in comprising enhancement-mode pHEMTs as first and third control element T1, T3. The D-mode pHEMT amplifier differs from the differential amplifier circuit DA in comprising depletion-mode pHEMTs as first and third control element T1, T3. All three amplifier circuit comprise long-gate pHEMTs as second and as fourth control element T2, T4. The D-mode amplifier circuit and E-mode amplifier circuit represent pHEMT-only circuits.

Figure 2:
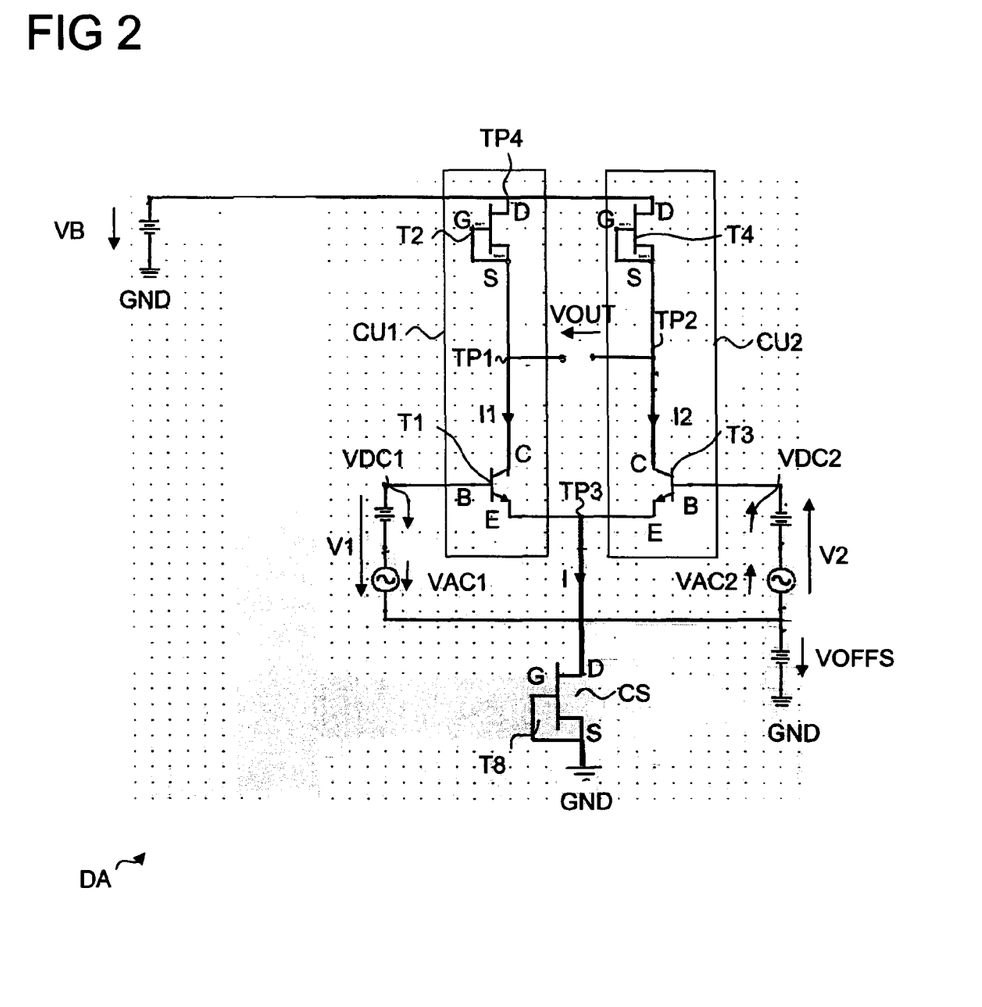

FIGS. 3a to 3d refer to simulation results of a circuit arrangement of the differential amplifier circuit DA according to FIG. 2. The E-mode pHEMT amplifier circuit and the D-mode pHEMT amplifier circuit are also arranged according to the circuit arrangement as illustrated in FIG. 2 and are dimensioned similar to the differential amplifier circuit DA to allow a comparison to the differential amplifier circuit DA.

A dashed line L1 in FIGS. 3a to 3d is associated with the differential amplifier circuit DA, a dotted line L2 is associated with the D-mode pHEMT amplifier circuit and a continuous line L3 is associated with the E-mode pHEMT amplifier circuit.

Figure 3A:
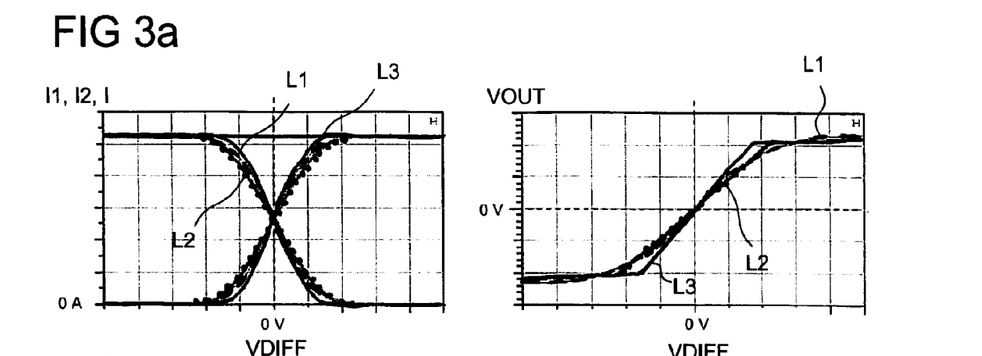

The diagrams in FIG. 3a show the currents and the output voltage VOUT versus a differential voltage VDIFF. The particular first AC-voltage VAC1 and second AC-voltage VAC2 are set to 0 V.

A voltage difference between the first DC-voltage VDC1 and the second DC-voltage VDC2 represents the differential voltage VDIFF. The first and second DC-voltage VDC1, VDC2 may have same polarities and but may be electrically coupled in opposite directions and may have for example a particular magnitude of half of the differential voltage VDIFF. A predetermined set of values of the first and second DC-voltage VDC1, VDC2 represent a corresponding operating point of the particular amplifier circuit.

The left diagram of FIG. 3a shows the first branch current I1, the second branch current I2 and the current I versus the differential voltage VDIFF. A value of the differential voltage VDIFF of 0 V represents an operating point where a value of the first branch current I1 basically equals a value of the second branch current I2. While moving the operating point of the particular amplifier circuit by increasing the value of the differential voltage VDIFF from 0 V towards positive values, the value of the first branch current I1 increases while the value of the second branch current I2 decreases. While decreasing the value of the differential voltage VDIFF from 0 V towards negative values, the value of the first branch current I1 decreases while the value of the second branch current I2 increases. A sum of the first and second branch current I1, I2 basically results in a constant current value, for example 50 μA, represented by the current I which is demanded by the particular current sink CS (see horizontal line in the left diagram FIG. 3a). Similar predetermined first and second DC-voltages VDC1, VDC2 result in similar first and second branch currents I1, I2 for the E-mode pHEMT amplifier circuit, the D-mode pHEMT amplifier circuit and the differential amplifier circuit DA.

A right diagram of FIG. 3a represents the output voltage VOUT of the particular amplifier circuit versus the differential voltage VDIFF. The output voltage VOUT represents a voltage difference between the second connection point TP2 and the first connection point TP1 of the particular amplifier circuit. The output voltage VOUT corresponds to the particular operating point represented by the predetermined differential voltage VDIFF. While moving the operating point of the particular amplifier circuit by increasing the value of the differential voltage VDIFF from 0 V towards positive values, the value of the first current part I1 increases and at the same time a voltage drop over the particular first control element T1 decreases, while the value of the second current part I2 decreases and a voltage drop over the third control element T3 increases. This results in an increasing value of the output voltage VOUT towards positive values. On the other hand, while decreasing the value of the differential voltage VDIFF from 0 V towards negative values, the voltage drop over the first control element T1 increases while the voltage drop over the third control element T3 decreases, thus resulting in increasing values of the output voltage VOUT towards negative values. The values of the output voltage VOUT of the particular amplifier circuit versus the differential voltage VDIFF are similar.

Figure 3B:
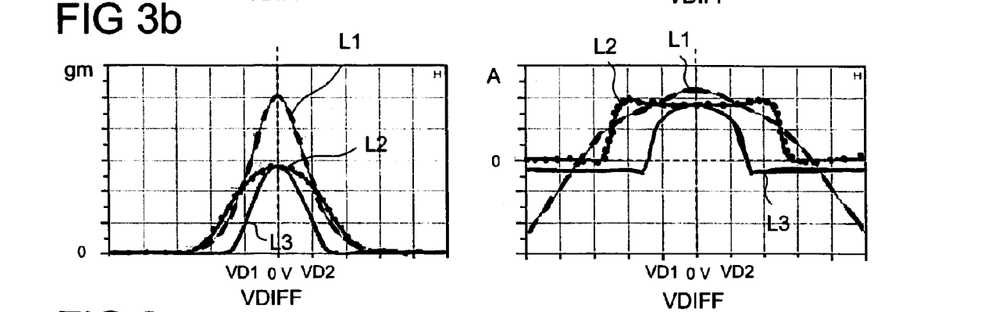
Figure 3C:
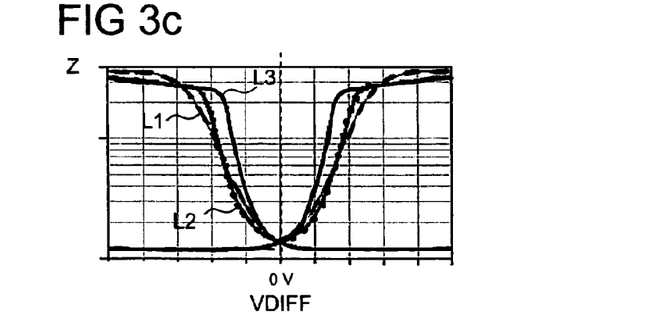

The simulation results in FIGS. 3b and 3c relate to small signal analysis of the particular amplifier circuit. In this case, the first predetermined voltage V1, which is supplied to the base B of the particular first control element T1, comprises the first AC-voltage VAC1 with a value unequal to 0 V. Furthermore, the base B of the particular third control element T3 is supplied by the second predetermined voltage V2 with a value of the second AC-voltage VAC2 being unequal to 0 V. A frequency f and a value of the predetermined first AC-voltage VAC1 is identical to a frequency and a value of the predetermined second AC-voltage VAC2. The frequency f is for example set to 1 MHz and a peak-value of the first AC-voltage VAC1 and a peak-value of the second AC-voltage VAC2 is for example set to 0.5 V. A direction of the first AC-voltage VAC1 is opposed to a direction of the second AC-voltage VAC2. This results in a magnitude of 1 V for the particular differential AC-voltage.

A left diagram of FIG. 3b represents a transconductance gm of the first control element T1 and the third control element T3 of the particular amplifier circuit versus the differential voltage VDIFF. As depicted in the left diagram of FIG. 3b, only one dashed line L1 is associated with the differential amplifier circuit DA and only one dotted line L2 is associated with the E-mode pHEMT amplifier circuit and only one continuous line L3 is associated with the D-mode pHEMT amplifier circuit. That is to say, that the transconductance gm of the first and third control element T1, T3 of the particular amplifier circuit are basically identical. The transconductance gm associated with the first control element T1 is a ratio of the first branch current I1 to the first predetermined voltage V1 and a transconductance associated with the third control element T3 is a ratio of the second branch current I2 to the second predetermined voltage V2. The transconductance gm of the first and third control element T1, T3 of the differential amplifier circuit DA is significantly larger than the transconductance of the E-mode pHEMTs of the E-mode amplifier circuit and of the D-mode pHEMTs of the D-mode pHEMT amplifier circuit.

A diagram in FIG. 3c shows an impedance Z of the second control element T2 and an impedance Z of the fourth control element T4 of the particular amplifier circuit in logarithmic representation versus the differential voltage VDIFF. The impedance Z of the second and fourth control element T2, T4 of the particular amplifier circuit are basically identical. As illustrated, a trace of the impedance Z depends on the predetermined differential voltage VDIFF. The difference in impedance Z for the E-mode pHEMT amplifier circuit, for the D-mode pHEMT amplifier circuit and for the differential amplifier circuit DA is due to different particular branch currents at the same differential voltage VDIFF.

A right diagram of FIG. 3b represents an AC-voltage gain A of the particular amplifier circuit versus the differential voltage VDIFF. The AC-voltage gain A represents a multiplication of the particular transconductance gm and the particular impedance Z for a given differential voltage VDIFF. A predetermined differential voltage VDIFF of a range between a first differential voltage VD1 and a second differential voltage VD2 results in a voltage gain A of the differential amplifier circuit DA that is higher compared with the voltage gain A of the E-mode pHEMT amplifier circuit and of the D-mode pHEMT amplifier circuit in this range.

Figure 3D:
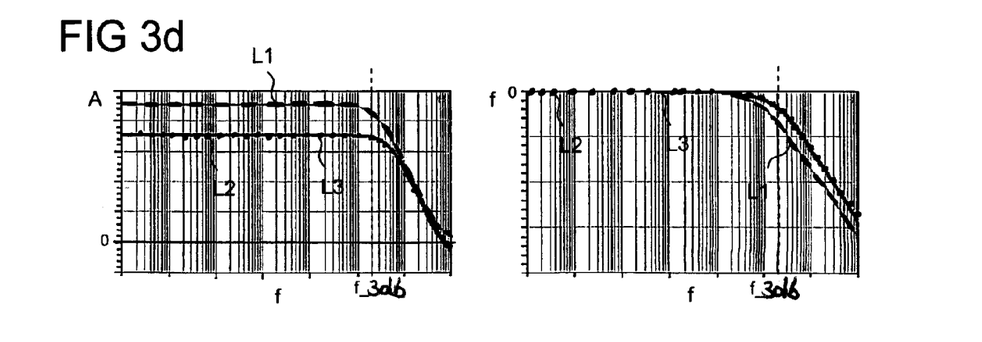

A left diagram of FIG. 3d represents the AC voltage gain A versus the frequency f of the first and second AC-voltages VAC1, VAC2 in logarithmic representation. For the simulation results depicted in FIG. 3d, the value of the differential voltage VDIFF is set to a constant value, for example to 0 V. The voltage gain A shown in the left diagram of FIG. 3d corresponds to the voltage gain A for the differential voltage VDIFF of 0 V shown the right diagram of FIG. 3b. As illustrated the AC-voltage gain A, for example 23 dB, of the differential amplifier circuit DA is significantly higher compared with the AC-voltage gains A of the E-mode pHEMT and D-mode pHEMT amplifier circuit over a wide range of frequencies f. A cut-off frequency f_3 db of the differential amplifier circuit DA is for example 100 MHz.

A right diagram of FIG. 3d presents a phase response φ of the particular amplifier circuit versus the frequency f of the first and second AC-voltage VAC1, VAC2 in logarithmic representation. The phase response φ is similar for all amplifier circuits and is close to 0° until the particular cut-off frequency f_3 db is reached. The cut-off frequency f_3 db of the differential amplifier circuit DA may also be 100 MHz.

Figure 4:
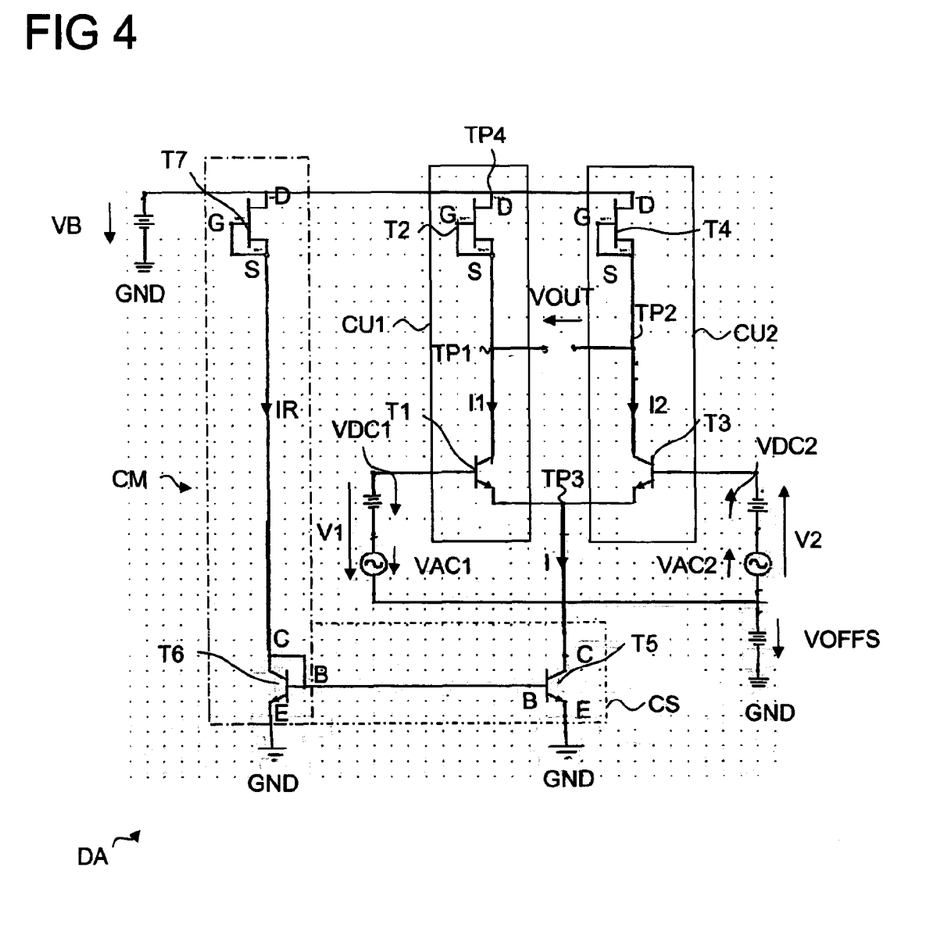

FIG. 4 depicts a third embodiment of the differential amplifier circuit DA with the current sink CS comprising a bias circuit CM. The bias circuit CM comprises a fifth control element T5, a sixth control element T6 and a seventh control element T7. The fifth and sixth control element T5, T6 are both npn-HBTs. A base B and a collector C of the sixth control element T6 are electrically shortened and a base B of the fifth control element T5 is electrically coupled to the base B of the sixth control element T6. The collector C of the fifth control element T5 is electrically coupled to the third connection point TP3 and an emitter E of the fifth control element T5 is electrically coupled to the reference potential GND.

The seventh control element T7 is a depletion mode long-gate pHEMT and is supplied with the supply voltage VB at its drain D. A gate G and a source S of the seventh control element T7 are electrically shortened and by this configured as active load. The source S of the seventh control element T7 is electrically coupled to the collector C of the sixth control element T6. An emitter E of the sixth control element T6 is electrically coupled to the reference potential GND. The sixth and seventh control element T6, T7 represent a further circuit unit beside the first and second circuit unit CU1, CU2.

The bias circuit CM is operable to mirror a predetermined reference current CS as current I which is demanded to flow through the fifth control element T5. The seventh control element T7 is configured in such in a way, for example by predetermining its channel width W and/or its channel length L, that a predetermined reference current IR and a corresponding current I is flowing, for example 50 uA.

Figure 5:
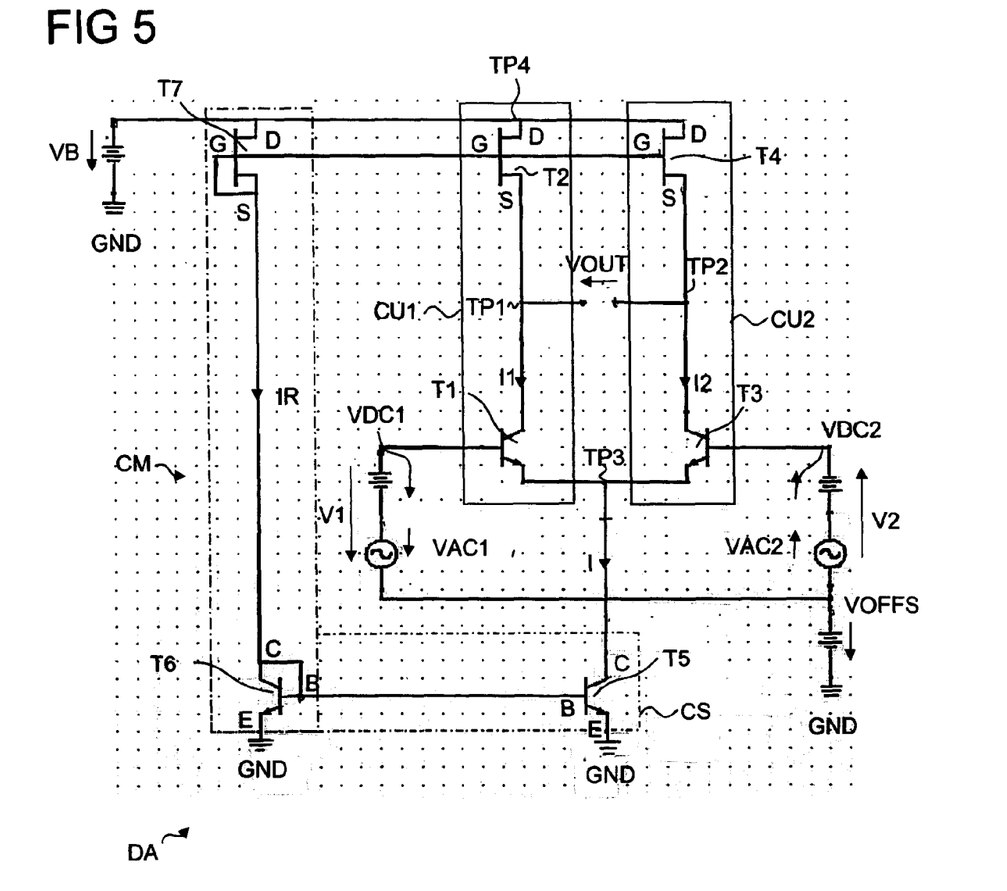

FIG. 5 depicts a fourth embodiment of the differential amplifier circuit DA. Compared with the differential amplifier circuit DA according to FIG. 4, the gate G of the second control element T2 and the gate G of the fourth control element T4 are not electrically shortened to their sources but electrically coupled to the gate G of the seventh control element T7.

FIGS. 6a to 6d refer to simulation results of a circuit arrangement of the differential amplifier circuit DA according to FIG. 5. The E-mode pHEMT amplifier circuit and the D-mode pHEMT amplifier circuit are also arranged according to the circuit arrangement as illustrated in FIG. 5 and are dimensioned similar to the differential amplifier circuit DA to allow a comparison to each other.

A dashed line L1 in FIGS. 6a to 6d is associated with the differential amplifier circuit DA, a dotted line L2 is associated with the D-mode pHEMT amplifier circuit and a continuous line L3 is associated with the E-mode pHEMT amplifier circuit.

Figure 6A:
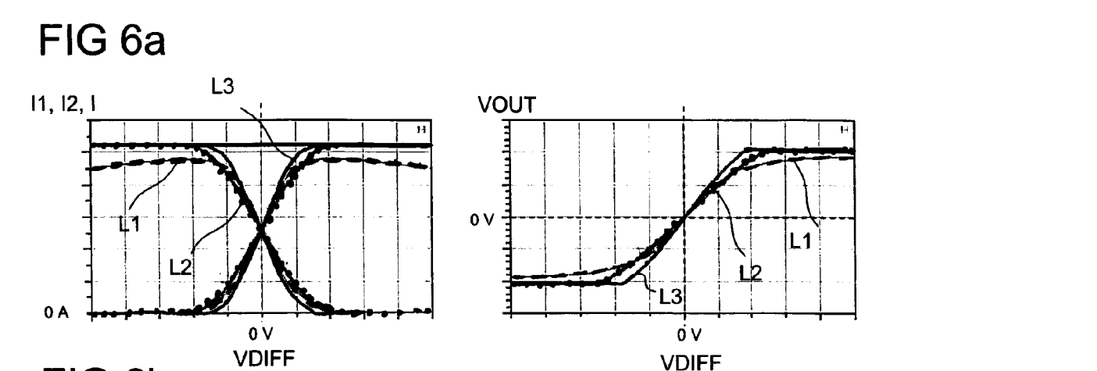

The diagrams in FIG. 6a show the currents and the output voltage VOUT versus the differential voltage VDIFF. The particular first AC-voltage VAC1 and second AC-voltage VAC2 are set to 0 V.

The left diagram of FIG. 6a represents the first branch current I1, the second branch current I2 and the current I versus the differential voltage VDIFF. A right diagram of FIG. 6a represents the output voltage VOUT of the particular amplifier circuit versus the differential voltage VDIFF. As illustrated in the left diagrams of FIG. 6a a value of the differential voltage VDIFF of 0 V represents an operating point where a value of the first branch current I1 equals a value of the second branch current I2. While moving the operating point of the particular amplifier circuit by increasing the value of the differential voltage VDIFF from 0 V towards positive values, the value of the first branch current I1 increases while the value of the second branch current I2 decreases. While decreasing the value of the differential voltage VDIFF from 0 V towards negative values, the value of the first branch current I1 decreases while the value of the second branch current I2 increases. The sum of the first and second branch current I1, I2 basically results in a constant current value represented by the current I which is demanded by the particular current sink CS (see horizontal line in the left diagram FIG. 6a). Similar predetermined first and second DC-voltages VDC1, VDC2 result in similar first and second branch currents I1, I2 for the E-mode pHEMT amplifier circuit, the D-mode pHEMT amplifier circuit and the differential amplifier circuit DA.

A right diagram of FIG. 6a represents the output voltage VOUT of the particular amplifier circuit versus the differential voltage VDIFF. The output voltage VOUT represents the voltage difference between the second connection point TP2 and the first connection point TP1 of the particular amplifier circuit. As illustrated, the values of the output voltage VOUT of the particular amplifier circuit versus the differential voltage VDIFF are similar.

Figure 6B:
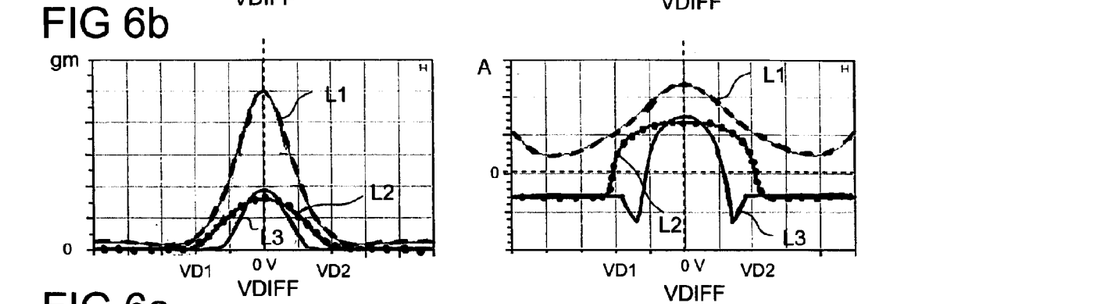
Figure 6C:
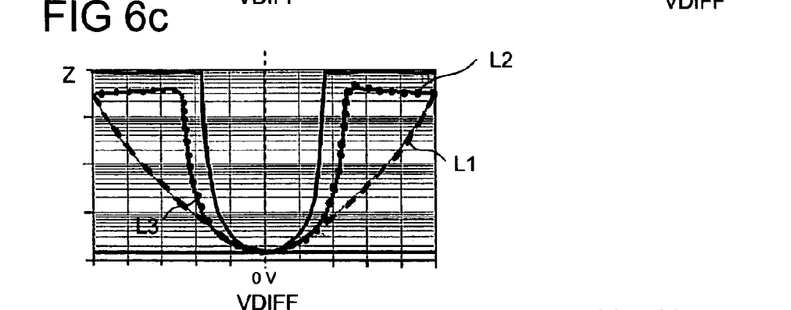

The simulation results in FIGS. 6b and 6c relate to small signal analysis of the particular amplifier circuit. The frequency f and the value of the first AC-voltage VAC1 and of the second AC-voltage VAC2 may be set as already described according to FIGS. 3b and 3c.

A left diagram of FIG. 6b represents the transconductance gm of the first control element T1 and the third control element T3 of the particular amplifier circuit versus the differential voltage VDIFF. As depicted in the left diagram of FIG. 6b, the transconductance gm of the first and third control element T1, T3 of the three amplifier circuits are basically identical. Furthermore, the transconductance gm of the first and third control element T1, T3 of the differential amplifier circuit DA are significantly larger compared with the first and third control element T1, T3 of the E-mode pHEMT amplifier circuit and of the D-mode pHEMT amplifier circuit.

A diagram in FIG. 6c shows an impedance Z of the second control element T2 and an impedance Z of the fourth control element T4 of the particular amplifier circuit in logarithmic representation versus the differential voltage VDIFF. The impedance Z of the second and fourth control element T2, T4 of the particular amplifier circuit are basically identical. The traces of the impedance Z of the three amplifier circuits differ from each other. The difference in impedance Z for the E-mode pHEMT amplifier circuit, for the D-mode pHEMT amplifier circuit and for the differential amplifier circuit DA is due to different particular branch currents at the same differential voltage VDIFF.

A right diagram of FIG. 6b represents the AC-voltage gain A of the particular amplifier circuit versus the differential voltage VDIFF. As illustrated, the AC-voltage gain A of the differential amplifier circuit DA is significantly higher than the AC-voltage gain A of the E-mode pHEMT amplifier circuit and the D-mode pHEMT amplifier circuit. As long as the transconductance gm of the particular first and third control element T1, T3 is larger than 0 A/V, the particular amplifier circuit features a positive AC-voltage gain A. A first differential voltage VD1 and a second differential voltage VD2 represent a differential voltage VDIFF range wherein each of the D-mode pHEMTs of the D-mode pHEMT amplifier circuit and each of the E-mode pHEMTs of the E-mode pHEMT amplifier circuit features a transconductance gm larger than 0 A/V, while differential voltages VDIFF outside of this voltage range feature a transconductance gm close to 0 A/V.

Figure 6D:
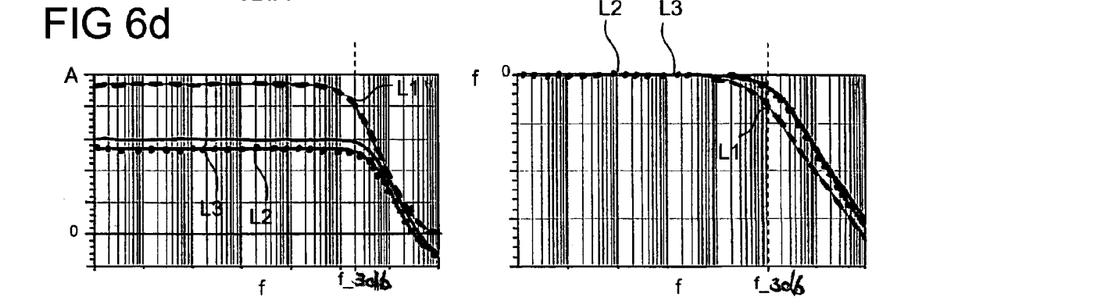

A left diagram of FIG. 6d represents the AC voltage gain A versus the frequency f of the first and second AC-voltages VAC1, VAC2 in logarithmic representation. The differential voltage VDIFF is set as already described according to FIG. 3d. The differential amplifier circuit DA features an AC-voltage gain A that is significantly higher compared with the E-mode pHEMT and D-mode pHEMT amplifier circuit over a wide range of frequencies f.

A right diagram of FIG. 6d presents the phase response φ of the particular amplifier circuit versus the frequency f of the first and second AC-voltage VAC1, VAC2 in logarithmic representation. The phase response φ is similar for all amplifier circuits and is close to 0° until the particular cut-off frequency f_3 db is reached. The cut-off frequency f_3 db of the differential amplifier circuit DA may also be 100 MHz.

Figure 7:
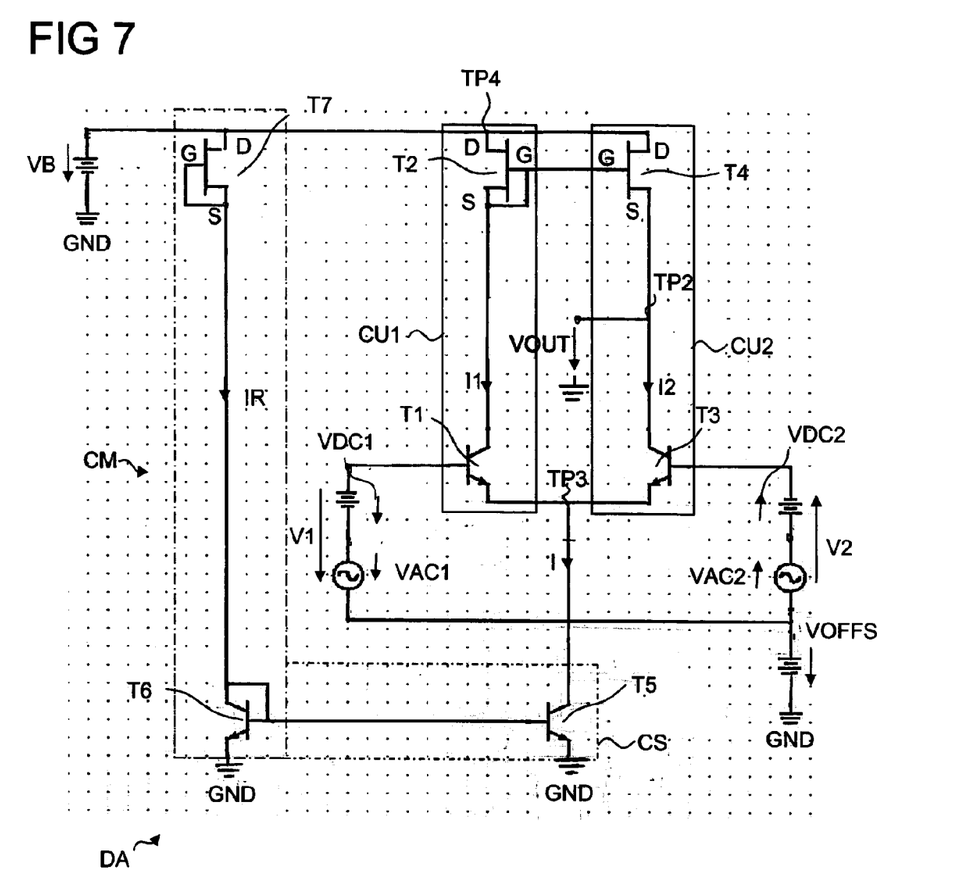

FIG. 7 depicts a fifth embodiment of the differential amplifier circuit DA. In comparison to FIG. 4, the gates G of the second and fourth control element T2, T4 are electrically coupled to each other, whereas the gate G and the source S of the second control element T2 are electrically shortened. Furthermore, the output voltage VOUT corresponds to a voltage between the second connection point TP2 and the reference potential GND. By this, the differential amplifier circuit DA according to the fifth embodiment represents a single-ended or asymmetric output amplifier.

FIGS. 8a to 8d refer to simulation results of a circuit arrangement of the differential amplifier circuit DA according to FIG. 7. The E-mode pHEMT amplifier circuit and the D-mode pHEMT amplifier circuit are arranged according to the circuit arrangement as illustrated in FIG. 7 too and are dimensioned similar to the differential amplifier circuit DA to allow a comparison to each other.

A dashed line L1 in FIGS. 8a to 8d is associated with the differential amplifier circuit DA, a dotted line L2 is associated with the D-mode pHEMT amplifier circuit and a continuous line L3 is associated with the E-mode pHEMT amplifier circuit.

Figure 8A:
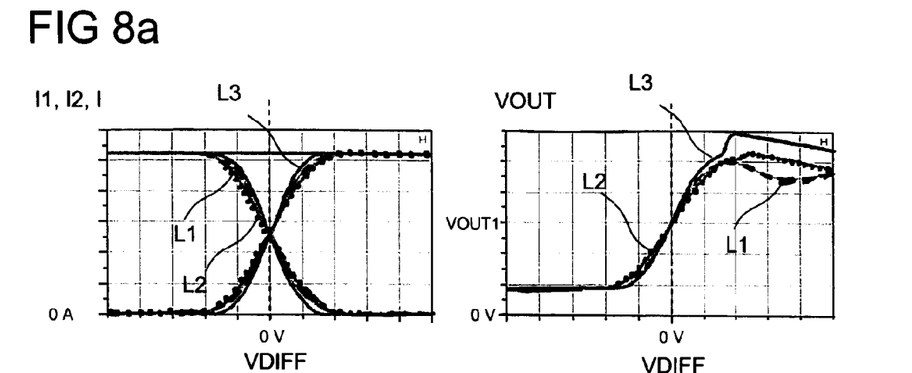

The diagrams in FIG. 8a show the currents and the output voltage VOUT versus the differential voltage VDIFF. The particular first AC-voltage VAC1 and second AC-voltage VAC2 are set to 0 V.

As illustrated in the left diagrams of FIG. 8a a value of the differential voltage VDIFF of 0 V represents an operating point where the value of the first branch current I1 equals the value of the second branch current I2. While moving the operating point of the particular amplifier circuit by increasing the value of the differential voltage VDIFF from 0 V towards positive values, the value of the first branch current I1 increases while the value of the second branch current I2 decreases. While decreasing the value of the differential voltage VDIFF from 0 V towards negative values, the value of the first branch current I1 decreases while the value of the second branch current I2 increases. The sum of the first and second branch current I1, I2 basically results in a constant current value represented by the current I which is demanded by the particular current sink CS (see horizontal line in the left diagram FIG. 8a). Similar predetermined first and second DC-voltages VDC1, VDC2 result in similar first and second branch currents I1, I2 for the E-mode pHEMT amplifier circuit, the D-mode pHEMT amplifier circuit and the differential amplifier circuit DA.

A right diagram of FIG. 8a represents the output voltage VOUT of the particular amplifier circuit versus the differential voltage VDIFF. The output voltage VOUT represents an voltage between the second connection point TP2 and the reference potential GND. As illustrated, the output voltage VOUT varies around a voltage value VOUT1 when varying the operating point of the particular amplifier circuit by varying the particular differential voltage VDIFF. In the previous embodiments, the output voltage VOUT varies around a value of 0 V.

Figure 8B:
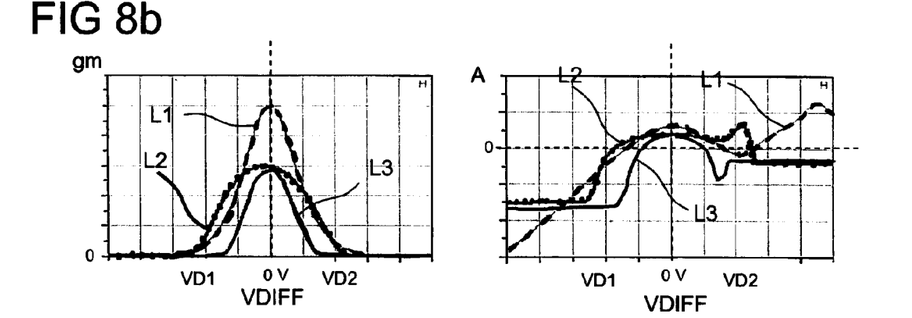
Figure 8C:
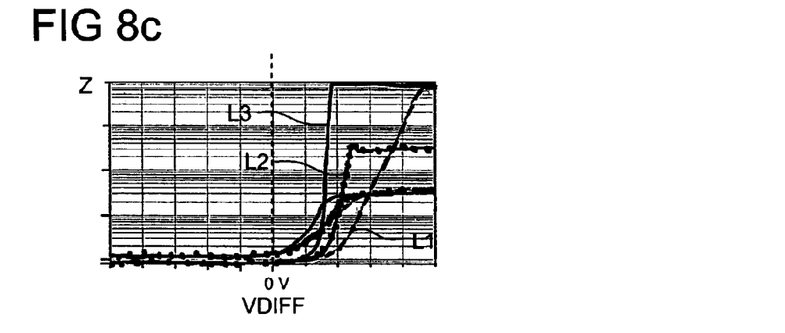

The simulation results in FIGS. 8b and 8c relate to small signal analysis of the particular amplifier circuit. The frequency f and the value of the first AC-voltage VAC1 and of the second AC-voltage VAC2 may be set as already described according to FIGS. 3b and 3c.

A left diagram of FIG. 8b represents the transconductance gm of the first control element T1 and the third control element T3 of the particular amplifier circuit versus the differential voltage VDIFF. As depicted in the left diagram of FIG. 6b, the transconductance gm of the first and third control element T1, T3 are basically identical. The first and third control element T1, T3 of the differential amplifier circuit DA features a larger value of the transconductance gm compared with the E-mode pHEMT amplifier circuit and D-mode pHEMT amplifier circuit. In particular in case of a differential voltage VDIFF of 0 V the first and third control element T1, T3 of the differential amplifier circuit DA feature the highest value of their transconductance gm.

A diagram in FIG. 8c represents the impedance Z of the second control element T2 and the impedance Z of the fourth control element T4 of the particular amplifier circuit in logarithmic representation versus the differential voltage VDIFF. The impedance trace of all three amplifier circuits differ from each other. The difference in impedance Z for the E-mode pHEMT amplifier circuit, for the D-mode pHEMT amplifier circuit and for the differential amplifier circuit DA is due to different particular branch currents at the same differential voltage VDIFF.

A right diagram of FIG. 8b represents the AC-voltage gain A of the particular amplifier circuit versus the differential voltage VDIFF. As illustrated, the AC-voltage gain A of the differential amplifier circuit DA is higher than the AC-voltage gain A of the E-mode pHEMT and D-mode pHEMT amplifier circuits when the operating point is set to a differential voltage VDIFF of 0 V.

Figure 8D:
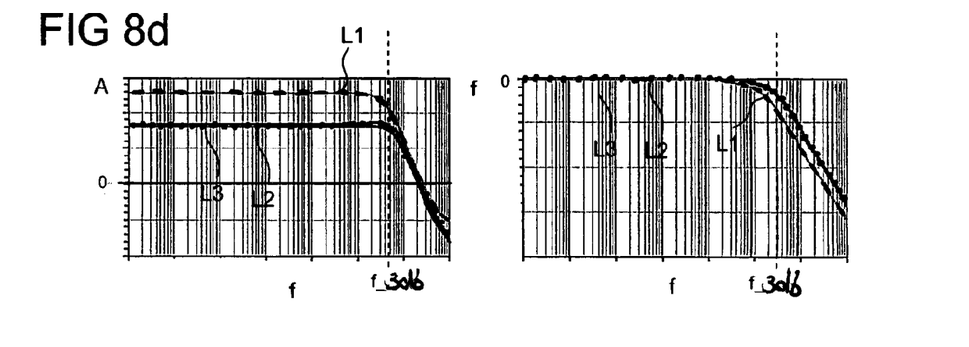

A left diagram of FIG. 8d represents the AC voltage gain A versus the frequency f of the first and second AC-voltages VAC1, VAC2 in logarithmic representation. For the simulation results depicted in FIG. 8d, the value of the differential voltage VDIFF is set to a constant value, for example to 0 V. The differential amplifier circuit DA features an AC-voltage gain A that is significantly higher compared with the E-mode pHEMT and D-mode pHEMT amplifier circuit over a wide range of frequencies f.

A right diagram of FIG. 8d presents the phase response φ of the particular amplifier circuit versus the frequency f of the first and second AC-voltage VAC1, VAC2 in logarithmic representation. The phase response φ is similar for all amplifier circuits and is close to 0° until the particular cut-off frequency f_3 db is reached. The cut-off frequency f_3 db of the differential amplifier circuit DA may also be 100 MHz.

Figure 9A:
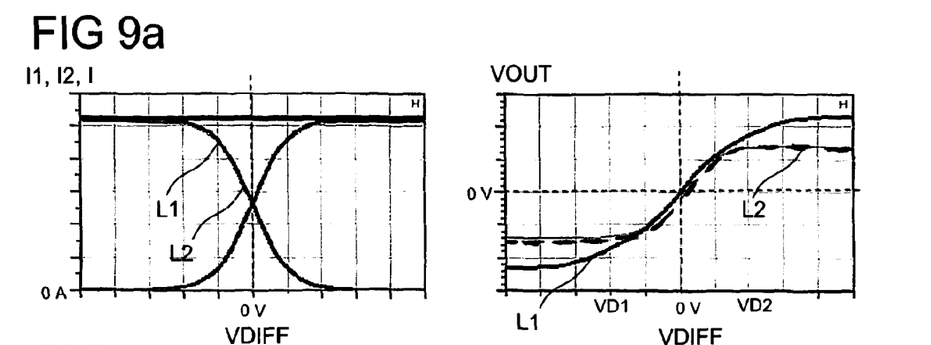
Figure 9B:
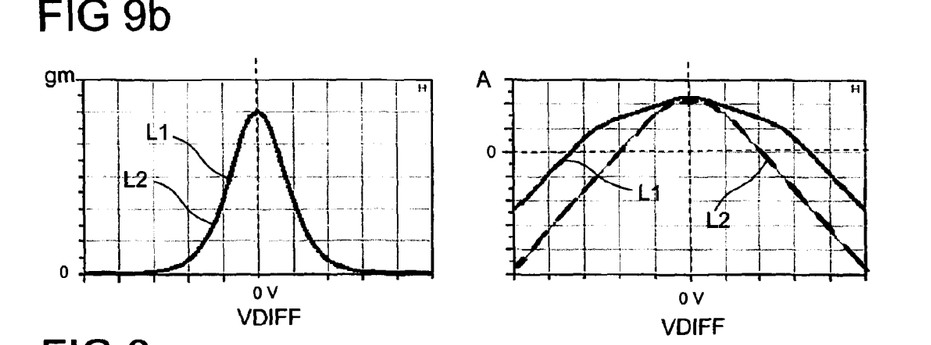
Figure 9C:
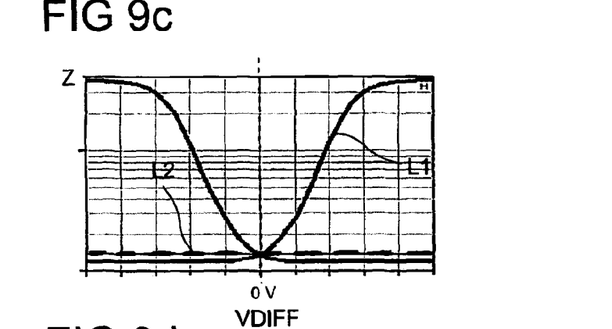
Figure 9D:
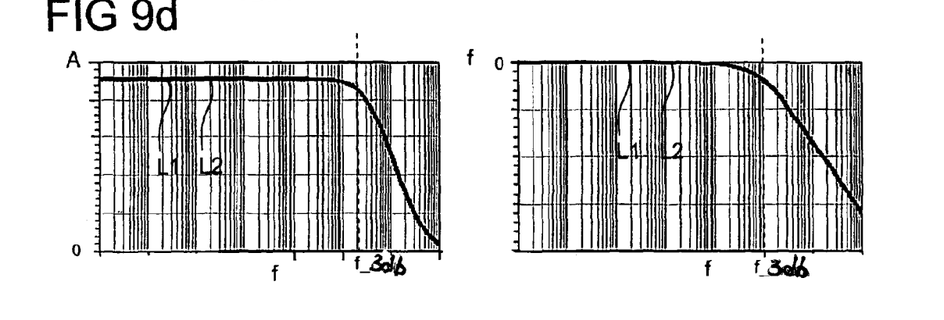
Figure 10:
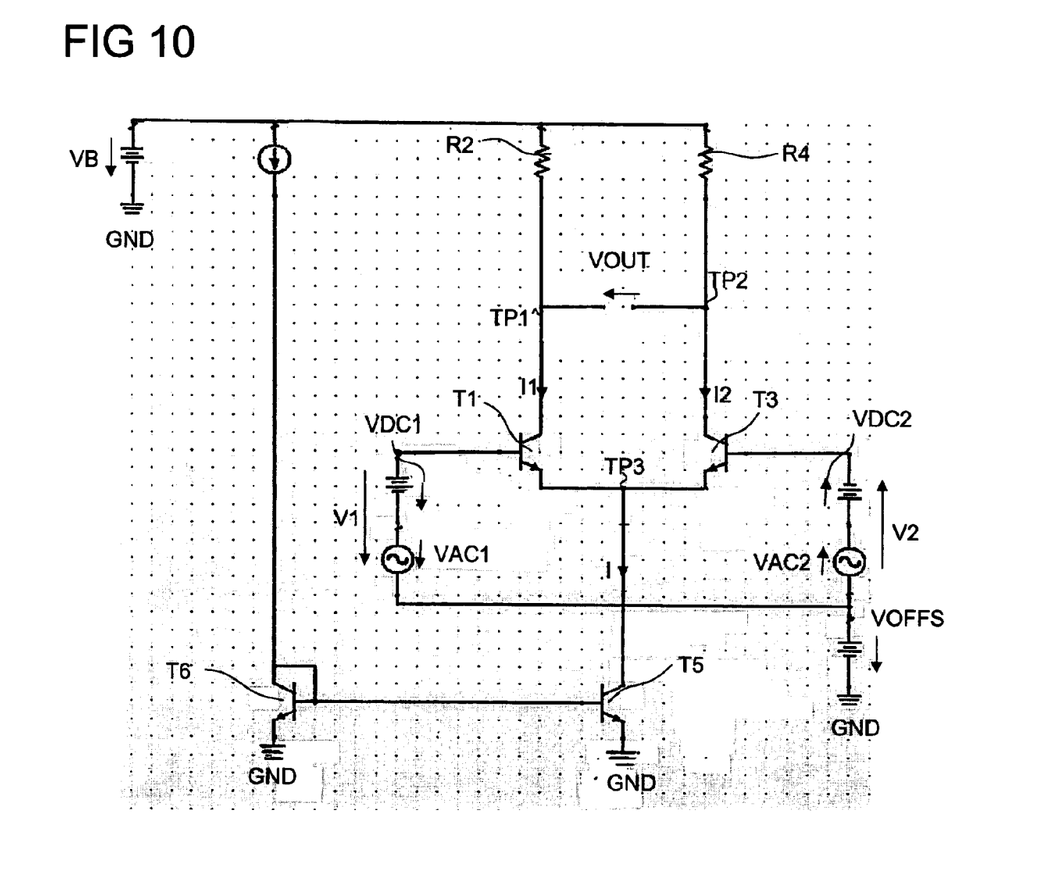

FIGS. 9a to 9d depict simulation results of a circuit arrangement of the differential amplifier circuit DA according to FIG. 1 and of another amplifier circuit according to FIG. 10. Both amplifier circuits have the same circuit arrangement and are dimensioned similar to allow a comparison to each other. Both amplifier circuits comprise HBTs as first and third control element T1, T3. But instead of D-mode long-gate pHEMTs as second and fourth control element T2, T4, the other amplifier circuit comprises a first resistor R2 and a second resistor R4 with both having identical predetermined resistance values, for example 13 kOhms.

A continuous line L1 in FIGS. 9a to 9d is associated with the differential amplifier circuit DA and a dotted line L2 is associated with the other amplifier circuit.

The diagrams in FIG. 9a show the currents and the output voltage VOUT versus the differential voltage VDIFF. The particular first AC-voltage VAC1 and second AC-voltage VAC2 are set to 0 V.

The left diagram of FIG. 9a represents the first branch current I1, the second branch current I2 and the current I versus the differential voltage VDIFF. As illustrated in the left diagram of FIG. 9a, a value of the differential voltage VDIFF of 0 V represents an operating point where a value of the first branch current I1 equals a value of the second branch current I2. As illustrated the trace of the first and second branch currents I1, I2 are similar to each other. The sum of both the first and second branch current I1, I2 results basically in the current I which is demanded by the current sink CS.

A right diagram of FIG. 9a represents the output voltage VOUT of the particular amplifier circuit versus the differential voltage VDIFF. The output voltage VOUT represents a voltage difference between the second connection point TP2 and the first connection point TP1 of the particular amplifier circuit. As illustrated, the values of the output voltage VOUT of the differential amplifier circuit DA and the other amplifier circuit are similar versus the differential voltage VDIFF, in particular in a predetermined range between a first differential voltage VD1 and a second differential voltage VD2. Out of this range, the differential amplifier circuit DA features larger values of the output voltage VOUT according to amount compared with the other amplifier circuit.

The simulation results in FIGS. 9b and 9c relate to small signal analysis of the particular amplifier circuit. The frequency f and the value of the first AC-voltage VAC1 and of the second AC-voltage VAC2 may be set as already described according to FIGS. 3b and 3c.

A left diagram of FIG. 9b represents a transconductance gm of the first control element T1 and the third control element T3 of the particular amplifier circuit versus the differential voltage VDIFF. As depicted in the left diagram of FIG. 9b, the transconductance gm of the first and third control element T1, T3 are basically identical. The trace of the transconductance gm is basically identical for both amplifier circuits. This results from the first and third control element T1, T3 being HBTs in both amplifier circuits.

A diagram in FIG. 9c shows the impedance Z of the second control element T2 and the impedance Z of the fourth control element T4 of the particular amplifier circuit in logarithmic representation versus the differential voltage VDIFF. A difference between the differential amplifier circuit DA and the other amplifier circuits can be seen in FIG. 9c. The trace of the impedance Z of the second and fourth control element T2, T4 of the other amplifier circuit stays constant independently from the differential voltage VDIFF due to the resistors R2, R4. The trace of the impedance Z of the second and fourth control element T2, T4 of the differential amplifier circuit DA increases according to amount dependently on the differential voltage VDIFF. As illustrated in FIG. 9c, the second and fourth control element T2, T4 of the differential amplifier circuit DA may be dimensioned in such a way, that the impedance Z of both control elements T2, T4 equal the impedance Z of the first and second resistor R2, R4 of the other amplifier circuit in case of a differential voltage VDIFF of 0 V. Alternatively, the dimension of the second and fourth control element T2, T4 of the differential amplifier circuit DA may differ from those of the other amplifier circuit.

A right diagram of FIG. 9b represents the AC-voltage gain A of the particular amplifier circuit versus the differential voltage VDIFF. In case of a differential voltage VDIFF of 0 V, the AC-voltage gains A of the differential amplifier circuit DA and of the other amplifier circuit are basically identical. Other values of the differential voltage VDIFF are associated with higher AC-voltage gains A of the differential amplifier circuit DA compared with the AC-voltage gains A of the other amplifier circuit.

A left diagram of FIG. 9d represents the AC voltage gain A versus the frequency f of the first and second AC-voltages VAC1, VAC2 in logarithmic representation. The value of the differential voltage VDIFF is set to a constant value, for example to 0 V. The AC-voltage gain A of the differential amplifier circuit DA and of the other amplifier circuit are basically identical. A cut-off frequency f_3 db of the differential amplifier circuit DA is for example 100 MHz.

A right diagram of FIG. 9d presents the phase response φ of the particular amplifier circuit versus the frequency f of the first and second AC-voltage VAC1, VAC2 in logarithmic representation. The phase response φ is similar for both amplifier circuits and is close to 0° until the particular cut-off frequency f_3 db is reached. The cut-off frequency f_3 db of the differential amplifier circuit DA may also be 100 MHz.

The present examples and embodiments are to be considered as illustrative and not restrictive, and the invention is not to be limited to the details given herein, but may be modified within the scope and equivalence of the appended claims.

REFERENCE NUMERALS

CS current sink
φ phase
A voltage gain
B base
C collector
CM bias circuit
CS current sink
CU1 first circuit unit
CU2 second circuit unit
D drain
DA differential amplifier circuit
E emitter
f frequency
f_3 db cut-off frequency
G gate
GND reference potential
I current
I1 first branch current
I2 second branch current
IR reference current L channel length
L1, L2, L3 lines
R2, R4 resistors
S source
T1 first control element
T2 second control element
T3 third control element
T4 fourth control element
T5 fifth control element
T6 sixth control element
T7 seventh control element
T8 eighth control element
TP1 first connection point
TP2 second connection point
TP3 third connection point
TP4 fourth connection point
V1 first predetermined voltage
V2 second predetermined voltage
VAC1 first AC-voltage
VAC2 second AC-voltage
VB supply voltage
VD1 first differential voltage value
VD2 second differential voltage value
VDC1 first DC-voltage
VDC2 second DC-voltage
VDIFF differential voltage
VOFFS offset voltage
VOUT output voltage
W channel width
W/L ratio of channel width and channel length
Z impedance

The invention claimed is:

1. Bias circuit with a circuit unit, the circuit unit comprising a heterojunction bipolar transistor and a long-gate pseudomorphic high-electron-mobility transistor, wherein either a source or a drain of the long-gate pseudomorphic high-electron-mobility transistor is electrically coupled with either a collector or emitter of the heterojunction bipolar transistor, with the heterojunction bipolar transistor of the circuit unit being a sixth control element and with the long-gate pseudomorphic high-electron-mobility transistor of the circuit unit being a seventh control element, and with a fifth control element comprising another heterojunction bipolar transistor, whereas a base and the collector of the sixth control element are electrically shorted and a base of the fifth control element is electrically coupled to the base of the sixth control element.

2. Bias circuit according to claim 1, wherein the long-gate pseudomorphic high-electron-mobility transistor comprises a channel length that is equal or larger than 0.5 μm.

3. Bias circuit according to claim 1, wherein the long-gate pseudomorphic high-electron-mobility transistor comprises a channel with a channel length being significantly larger than a channel width.

4. Bias circuit according to claim 1, wherein the circuit unit is integrated on a single chip by using GaAs BiFET or BiHEMT technology.

5. Bias circuit according to claim 1, whereas a gate and the source of the seventh control element are electrically shorted or bypassed.

6. Differential amplifier circuit comprising
a first circuit unit including a heterojunction bipolar transistor and a long-gate pseudomorphic high-electron-mobility transistor, wherein either a source or a drain of the long-gate pseudomorphic high-electron-mobility transistor is electrically coupled with either a collector or emitter of the heterojunction bipolar transistor, with the heterojunction bipolar transistor being a first control element and with its long-gate pseudomorphic high-electron-mobility transistor being a second control element,
a second circuit unit including a heterojunction bipolar transistor and a long-gate pseudomorphic high-electron-mobility transistor, wherein either a source or a drain of the long-gate pseudomorphic high-electron-mobility transistor is electrically coupled with either a collector or emitter of the heterojunction bipolar transistor, with the heterojunction bipolar transistor being a third control element and with its long-gate pseudomorphic high-electron-mobility transistor being a fourth control element, whereas the first control element and the third control element are electrically coupled via a connection point and the second control element and the fourth control element are electrically coupled via a further connection point,
a current sink being electrically arranged between a reference potential and the connection point and being operable to demand a predetermined current through the first circuit unit and/or the second circuit unit.

7. Differential amplifier circuit according to claim 6, the current sink comprising a bias circuit with the heterojunction bipolar transistor of the circuit unit being a sixth control element and with the long-gate pseudomorphic high-electron-mobility transistor of the circuit unit being a seventh control element, and with a fifth control element comprising another heterojunction bipolar transistor, whereas a base and the collector of the sixth control element are electrically shorted and a base of the fifth control element is electrically coupled to the base of the sixth control element, whereas the fifth control element of the bias circuit being electrically arranged between the reference potential and the connection point, whereas the circuit unit of the bias circuit is electrically arranged between the reference potential and the further connection point.

8. Differential amplifier circuit according to claim 6, the current sink comprising an eighth control element which is a depletion-mode long-gate pseudomorphic high-electron-mobility transistor with its gate and source being electrically shorted, whereas the eighth control element being electrically arranged between the reference potential and the connection point.

9. Differential amplifier circuit according to claim 6, whereas a gate of the second control element and a gate of the fourth control element are electrically coupled to the electrically shorted gate and source of the seventh control element.

10. Differential amplifier circuit according to claim 6, whereas a gate of the second control element and a gate of the fourth control element are electrically coupled to each other and the gate and the source of either the second control element or the fourth control element are electrically shorted or bypassed.

11. Differential amplifier circuit according to claim 6, whereas a gate and the source of the second control element are electrically shorted or bypassed and a gate and the source of the fourth control element are electrically shorted or bypassed.

12. Differential amplifier circuit according to claim 6, whereas the differential amplifier circuit is integrated on a single chip.

* * * * *